US005695557A

United States Patent [19]

Yamagata et al.

[11] Patent Number: 5,695,557
[45] Date of Patent: Dec. 9, 1997

[54] PROCESS FOR PRODUCING A SEMICONDUCTOR SUBSTRATE

[75] Inventors: Kenji Yamagata, Kawasaki; Takao Yonehara, Atsugi, both of Japan

[73] Assignee: Canon Kabushiki Kaisha, Tokyo, Japan

[21] Appl. No.: 364,969

[22] Filed: Dec. 28, 1994

[30] Foreign Application Priority Data

Dec. 28, 1993 [JP] Japan ................................. 5-337494

[51] Int. Cl.[6] ................................................ C30B 25/22
[52] U.S. Cl. ............................ 117/97; 117/2; 117/4; 117/7
[58] Field of Search ........................ 117/2, 4, 7, 97; 437/62, 83, 84

[56] References Cited

U.S. PATENT DOCUMENTS

| | | | |
|---|---|---|---|
| 5,190,613 | 3/1993 | Yamagata | 156/600 |
| 5,236,544 | 8/1993 | Yamagata | 156/603 |
| 5,250,460 | 10/1993 | Yamagata et al. | 148/DIG. 135 |
| 5,266,824 | 11/1993 | Abe et al. | 257/347 |
| 5,277,748 | 1/1994 | Sakaguchi et al. | 437/71 |
| 5,278,093 | 1/1994 | Yonehara | 437/109 |
| 5,290,712 | 3/1994 | Sato et al. | 437/24 |
| 5,371,037 | 12/1994 | Yonehara | 117/10 |
| 5,374,581 | 12/1994 | Ichikawa et al. | 437/62 |
| 5,403,751 | 4/1995 | Nishida et al. | 437/2 |
| 5,403,771 | 4/1995 | Nishida et al. | 437/89 |

FOREIGN PATENT DOCUMENTS

| | | | |
|---|---|---|---|
| 25048714 | 9/1992 | European Pat. Off. | H01L 21/76 |
| 2515181 | 11/1992 | European Pat. Off. | H01L 21/20 |
| 2553856 | 8/1993 | European Pat. Off. | H01L 21/76 |
| 2553859 | 8/1993 | European Pat. Off. | H01L 21/76 |
| 4-286310 | 10/1992 | Japan | 29/78 |

OTHER PUBLICATIONS

J. Haisma, et al., "Silicon–On–Insulator Wafer Bonding—Wafer Thinning Technological Evaluations," Japanese Journal Of Applied Physics, vol. 28, 1989, pp. 1426–1443.

Abe, et al. "Fabrications and Bonding Strengths of Bonded Silicon–Quartz Wafers," (Extended Abstracts of the 1992 Int'l Conference on Solid State Devices and Materials, Aug. 26–28, 1992), pp. 437–439.

Primary Examiner—Felisa Garrett
Attorney, Agent, or Firm—Fitzpatrick, Cella, Harper & Scinto

[57] ABSTRACT

A bonded substrate and a process for its production is provided to solve the problem involved in the heat treatment which tends to cause troubles such as break, separation and warpage of the substrates bonded. A single-crystal semiconductor epitaxially grown on a porous semiconductor substrate is bonded to an insulator substrate, and the semiconductor substrate is removed by etching, grinding, or a combination of the both, where no heat treatment is carried out or, even if carried out, only once.

9 Claims, 9 Drawing Sheets

PROCESS FOR PRODUCING A SEMICONDUCTOR SUBSTRATE

BACKGROUND OF THE INVENTION

1. Field of the Invention

This invention relates to a semiconductor substrate and a process for producing the same, and particularly to a process for producing a semiconductor substrate comprising a light-transmitting insulator substrate having thereon a single-crystal semiconductor layer. More particularly, this invention is concerned with a semiconductor substrate comprising a light-transmitting insulator substrate made of glass or the like on which a single-crystal semiconductor for fabricating a device thereon afterwards by epitaxy or ion implantation is formed.

2. Related Background Art

Formation of single-crystal silicon semiconductor layers on insulating materials is widely known as silicon-on-insulator (SOI) techniques, and many researches have been made since substrates thereby obtained have a number of advantages that can not be achieved by bulk silicon substrates for preparing usual silicon integrated circuits.

If single-crystal films grown on insulating films can be used as substrate materials of devices, this is very well favorable for device structure. Devices with a high performance (a high speed) and a high reliability can be aimed because 1) any parasitic (or floating) capacitance caused by substrate components can be made smaller, 2) devices can be tough to radiations and 3) latchup-free CMOS can be aimed. Hence, SOI devices have attracted notice.

Among SOI formation techniques recently reported, a technique especially superior in view of quality is what is called "bonding SOI". This is a technique in which mirror-finished surfaces of two wafers on at least one of which an insulating film has been formed by oxidation or the like are closely brought into face-to-face contact, followed by heating to strengthen the bond at the interface of close contact, and then the substrate is polished or etched on either side thereof so as to leave on the insulating film a single-crystal silicon thin film having any desired thickness. What is most important in this technique is the step of making the silicon layer into a thin film. This is because the above advantages of SOI can not be brought out unless silicon layers are made into thin films.

However, in order to make silicon layers into thin films, usually a silicon substrate of as large as several hundred μm must be uniformly polished or etched to have a thickness of several μm or 1 μm or less. It is technically very difficult to control such polishing or etching or to make the substrate thickness uniform. Because of such a difficulty in film thickness control, this "bonding SOI" has not been put into practical use irrespective of its possibility of providing best-quality single-crystal thin films among SOI techniques.

The bonding SOI has another important problem. It is a difference in coefficient of thermal expansion between insulator substrates and silicon substrates. This difference in coefficient of thermal expansion little comes into question when the silicon substrate is used on the side of the substrate serving as a support (i.e., when silicon substrates are bonded to each other). When, however, substrates having coefficients of thermal expansion greatly different from each other are bonded and any temperature changes occur, the difference in coefficient of thermal expansion between the both substrates causes a stress.

In practice, when an insulator substrate made of glass, other than silicon, is used on the side of the substrate serving as a support, the substrates may warp in the state of being bonded or the substrates may break or separate, because of such a difference in coefficient of thermal expansion between both substrates, at the step of heating them at about 1,000° C. in order to strengthen the bond at their interface. There are examples in which materials having a coefficient of thermal expansion close to that of silicon are synthesized and used as the supporting substrate. Such materials, however, have a poor thermal resistance as far as known in the art, and can not withstand process temperatures for the heat treatment applied to strengthen the bond or for the fabrication of devices.

Abe et al. report an example in which a "bonded SOI substrates" that can solve such problems is produced (Extended Abstract of the 1992 International Conference on SOLID-STATE DEVICES AND MATERIALS, 1992 Tsukuba, pp. 437–439, or Japanese Patent Application Laid-open No. 4-285310).

In the process reported therein, a relatively thin (300 μm) silicon substrate and a quartz substrate are bonded, and thereafter first heating is carried out at about 300° C. that may cause no separation or break of the bonded substrate, followed by etching only by which the silicon substrate is made thinner to have a thickness of about 150 μm. Next, as second heating, annealing is carried out at bout 450° C., to attain a bond strength high enough to withstand the shear stress during surface grinding, and the silicon substrate is then ground down to a thickness of several μm by means of a grinder. Thereafter, precision polishing is further carried out to make the silicon substrate into a thin film.

According to this process, however, since the heating is essential, a thin silicon substrate of about 300 μm thick must be used taking account of thermal stress. Hence, substrates may accidentally break during operations for bonding or transportation of substrates, and hence the operations must be carefully made. Moreover, in order to carry out heating at higher temperatures, it is necessary to repeat a cycle of the grinding to make substrates thinner and the heating thereafter carried out. For these reasons, bonding SOI substrates are disadvantageous in that their production speed can not be increased.

Stated specifically, the substrate thickness of the semiconductor substrate to be bonded must usually be about 500 μm in the case of a silicon substrate of 4 inches diameter and about 600 μm in the case of that of 5 to 6 inches diameter so that their mechanical strength can be maintained. In the case of a larger substrate of 8 inches diameter, a thick silicon substrate of about 800 μm thick must be used. When a thin substrate of about 300 μm thick is used, it becomes very difficult to handle the step of initial bonding.

There is still another disadvantage. It is a problem of separation caused by the shear stress applied between the insulator substrate and the semiconductor substrate. Every time silicon substrates are ground down to be made thinner, a great shear stress is applied to the bonding interface between the supporting substrate and the silicon substrate. In practice, silicon substrates are ground down or polished until they are made into thin films of several μm thick and hence a quite large shear stress is applied to the bonding interface. Moreover, at the joining surfaces of the both substrates, the bond at the bonding interface may become weaker with the repetition of grinding. To solve this problem, there is a method in which the step of making substrates thinner by grinding and the high-temperature heating are repeated so that the bond strength at the interface may not become poor. This method, however, takes a long time for the processing and is not suited for mass production.

A still another disadvantage is that, since single-crystal silicon thin films are produced by polishing, a special apparatus and a very precise control are required to achieve the uniformity of film thickness.

As another process for producing SOI substrates, there was a means of direct deposition of semiconductor films on insulator substrates. However, the semiconductor film can not be well crystallized on the insulator substrate, and it is impossible to form single-crystal semiconductor thin films.

As discussed above, conventional "bonding SOI substrates" can achieve no sufficient bond strength between the insulator substrate and the silicon substrate without heat treatment. On the other hand, as previously noted, the direct bonding of a silicon substrate and a transparent substrate having different coefficients of thermal expansion and the subsequent heating of the bonding cause the break or warpage of the substrates as previously stated. To solve such problems, up to now the heating has been delicately controlled under conditions such that a bond strength high enough to withstand the shear stress can be maintained and also no problems of break or warpage may be caused. Such control, however, is difficult since a very delicate control is required. Also, in practice, complicated steps must be taken such that the heating is carried out multi-stepwise from lower temperatures to high temperatures. Hence, this process can not produce SOI substrates feasible for mass production. To solve such problems, it is desired to obtain SOI substrates by polishing (or grinding) without the step of heat treatment. In other processes also, no techniques that can provide, in a good productivity, SOI substrates satisfactory for the fabrication of high-performance electronic devices has been still accomplished.

As an additional problem, when single-crystal semiconductor substrates are produced by conventional deposited film forming processes, not a few stacking faults may occur in single-crystal deposited films. In such a case, the layer defects become larger as the deposited films grow. This is diagrammatically illustrated in FIG. 10. Reference numeral 1000 denotes a semiconductor substrate made of silicon or the like; 1002, an epitaxial growth layer; and 1009, layer defects. On the surface of the substrate 1000, point defects, dust, oxide residues and so forth may remain, and they cause the stacking fault. As the single-crystal semiconductor layer 1002 is epitaxially grown, the stacking fault grows to an extent increasing toward the end in the epitaxial layer because of the point defects, dust, oxide residues and so forth. Hence, the layer deposition defects may greatly extend on the surface of the epitaxial layer 1002.

SUMMARY OF THE INVENTION

Accordingly, an object of the present invention is to provide a simplified process in which a transparent insulator substrate and a single-crystal silicon substrate having a coefficient of thermal expansion greatly different therefrom are put into one substrate by bonding of the latter to the former and a high-function and high-performance SOI substrate is produced from this substrate without the step of heating or, even when heating is carried out, through only one step of heating.

The present inventors made extensive studies taking account of the problems and disadvantages as discussed above. As a result, they have reached the following findings. That is, an SOI substrate that can solve the above problems can be produced when a single-crystal silicon layer is epitaxially grown on a porous silicon surface of a silicon substrate having been made porous on its surface, subsequently an insulator, different type substrate serving as a supporting substrate is brought into close contact with the surface of the epitaxially grown layer by only van der Waals force, without the heating to thereby minimize the influence of stress, the silicon substrate portion is removed by wet etching using an ethcing solution, followed by selective etching of the porous portion to form a single-crystal silicon thin film on the insulator substrate.

An SOI substrate that can solve the above problems can also be produced when, since it takes time for the wet etching of the monocrystalline semiconductor layer portion, the etching is replaced with grinding to remove part of the silicon substrate while the silicon substrate portion is still thick enough to make it unnecessary to take account of the shear stress at the interface between the substrates, and thereafter the silicon substrate portion having remained after grinding is removed by wet etching using an ethcing solution.

An SOI substrate that can solve the above problems can still also be produced when part of the silicon substrate is removed by grinding and then the heating to strengthen the bond between the substrates is carried out over the whole only once, followed by grinding to remove the silicon substrate portion having remained after the first grinding.

Employment of this process also makes it possible that any stacking fault having grown to a great extent on the surface of a semiconductor deposited film as the thickness of the deposited film increases when conventional single-crystal semiconductor deposited films are epitaxially grown are transferred to the side of the opposing bonding substrate. Hence, only stacking faults in small areas at the initial stage of the growth of stacking faults come to appear on the surfaces of semiconductor substrates important for fabricating devices thereon afterwards. The same effect can be obtained not only in the production of SOI substrates but also in the case of semiconductor substrates comprising a semiconductor substrate having thereon an epitaxial growth layer.

Some aspects of the present invention will be described below in detail. A first aspect of the present invention is a process for producing a semiconductor substrate, comprising successively the steps of:

anodizing a surface layer on one side of a single-crystal semiconductor substrate to make the surface layer porous to form a porous single-crystal semiconductor layer on a non-porous single-crystal semiconductor region;

epitaxially growing a non-porous single-crystal semiconductor layer on the porous single-crystal semiconductor layer;

bringing the surface of the non-porous single-crystal semiconductor layer into close contact with the surface of an insulator substrate and then bonding the both to each other substantially without heating;

grinding the non-porous single-crystal semiconductor region to remove part of the non-porous single-crystal semiconductor region;

etching the non-porous single-crystal semiconductor region having remained after the grinding step, to entirely remove the non-porous single-crystal semiconductor region to expose the porous single-crystal semiconductor layer; and selectively etching the porous single-crystal semiconductor layer to remove the porous single-crystal semiconductor layer.

In this process, after the step of grinding the non-porous single-crystal semiconductor region to remove part of the non-porous single-crystal semiconductor region, a step of heating the whole to strengthen the bond between the non-porous single-crystal semiconductor layer and the insulator substrate may be added. Also, in this process, the step of etching the non-porous single-crystal semiconductor region having remained after the grinding step to entirely remove the non-porous single-crystal semiconductor region to expose the porous single-crystal semiconductor layer may preferably be carried out in any of an alkali solution, an organic alkali solution and an acid solution containing hydrofluoric acid and nitric acid, kept at 100° C. or below. Still also, in this step, the step of grinding the non-porous single-crystal semiconductor region to remove part of the non-porous single-crystal semiconductor region may preferably be carried out in the manner that the non-porous single-crystal semiconductor region remains in a thickness of 100 μm or more.

A second aspect of the present invention is a process for producing a semiconductor substrate, comprising successively the steps of:

anodizing a surface layer on one side of a single-crystal semiconductor substrate to make the surface layer porous to form a porous single-crystal semiconductor layer on a non-porous single-crystal semiconductor region;

epitaxially growing a non-porous single-crystal semiconductor layer on the porous single-crystal semiconductor layer;

bringing the surface of the non-porous single-crystal semiconductor layer into close contact with the surface of an insulator substrate and then bonding the both to each other substantially without heating;

etching the non-porous single-crystal semiconductor region to entirely remove the non-porous single-crystal semiconductor region; and selectively etching the porous single-crystal semiconductor layer to remove the porous single-crystal semiconductor layer. In this process, the step of etching the non-porous single-crystal semiconductor region to entirely remove the non-porous single-crystal semiconductor region to expose the porous single-crystal semiconductor layer may preferably be carried out in any of an alkali solution, an organic alkali solution and an acid solution containing hydrofluoric acid and nitric acid, kept at 100° C. or below.

A third aspect of the present invention is a process for producing a semiconductor substrate, comprising successively the steps of:

anodizing a surface layer on one side of a single-crystal semiconductor substrate to make the surface layer porous to form a porous single-crystal semiconductor layer on a non-porous single-crystal semiconductor region;

epitaxially growing a non-porous single-crystal semiconductor layer on the porous single-crystal semiconductor layer;

bringing the surface of the non-porous single-crystal semiconductor layer into close contact with the surface of an insulator substrate and then bonding the both to each other without heating;

grinding the non-porous single-crystal semiconductor region to remove part of the non-porous single-crystal semiconductor region;

heating the whole to strengthen the bond between the non-porous single-crystal semiconductor layer and the insulator substrate;

grinding further the non-porous single-crystal semiconductor region having remained after the grinding step, to entirely remove the non-porous single-crystal semiconductor region to expose the porous single-crystal semiconductor layer; and selectively etching the porous single-crystal semiconductor layer to remove the porous single-crystal semiconductor layer. In this process, the step of grinding the non-porous single-crystal semiconductor region to remove part of the non-porous single-crystal semiconductor region may preferably be carried out in the manner that the non-porous single-crystal semiconductor region remains in a thickness of 100 μm or more.

In the process of the present invention, throughout the first to third embodiments, the step of pressing the substrates brought into close contact may be added before the non-porous single-crystal semiconductor region is removed. Also, the surface of the non-porous single-crystal semiconductor layer may be oxidized so that the surface oxide layer is brought into close contact with the insulator substrate. Still also, the selective etching of the porous single-crystal semiconductor layer may preferably be carried out in a mixed etching solution of hydrofluoric acid and aqueous hydrogen peroxide and using as the insulator substrate a light-transmitting insulator substrate mainly composed of $SiO_2$. Still also, the single-crystal semiconductor substrate may preferably be mainly composed of silicon.

The present invention also embraces a semiconductor substrate. The semiconductor substrate of the present invention is a semiconductor substrate comprising a substrate and a single-crystal semiconductor layer provided on the substrate, wherein a region where a stacking fault in the single-crystal semiconductor layer has extended is present not on the surface of the single-crystal semiconductor substrate, but in the single-crystal semiconductor layer in the vicinity of its bonding surface with the substrate, and a region of a small fault produced at the initial stage of the growth of the stacking fault is present on the surface of the single-crystal semiconductor layer. In this semiconductor substrate, the substrate may be a light-transmitting insulator substrate mainly composed of $SiO_2$. Also, the substrate may be a semiconductor substrate, in particular, a single-crystal silicon substrate.

In the first embodiment of the present invention, the single-crystal semiconductor (silicon) portion is partly removed by grinding and thereafter the remaining single-crystal silicon portion is entirely remove by etching. The reason why the grinding is first carried out is that it takes a quite long time when substrates usually having a thickness of from 500 to 600 μm or a thickness larger than that are made thin to a thickness of several ten μm or several μm only by wet etching. The silicon substrate portion is not entirely removed only by grinding but only part thereof is ground down, because the grinding exerts a quite large shear stress to the bonding interface and a great force is applied to the interface to cause separation or break if the substrate is ground down to a certain excessive extent. Hence, the minimum remaining thickness of the silicon substrate after grinding should be about 100 μm, which, however, depends on the flatness of substrates and the manner of cleaning them. So far as the remaining thickness is 100 μm at least, the substrate can withstand the grinding only by van der Waals force without heating after bonding. Thus, once the silicon substrate has come to have a remaining thickness of 100 μm, then the grinding must be changed for the etching with a solution so that the stress is no longer applied. Heating may be carried out once at the time the remaining thickness comes to be 100 μm, so that the final step, selective wet etching of the porous single-crystal silicon layer can be carried out stably and in a high yield.

In the second embodiment of the process of the present invention, the single-crystal silicon substrate is removed only by wet etching so that the step of heating that has been indispensable when only grinding is employed can be eliminated. Since in this embodiment the grinding step is not required, the processing steps can be lessened and neither polishing devices nor polishing materials become unnecessary.

In the third embodiment, part of the silicon substrate is removed not at one time but in twice. This is because the grinding exerts a quite large shear stress to the bonding interface and a great force is applied to the interface to cause separation or break if the substrate is ground down to a certain excessive extent. Namely, it is important to end the first-time grinding while the shear stress applied to the interface is still small. At this stage, the silicon substrate thus made thinner will no longer cause separation of the bonded surfaces even when heated to a certain extent, because the thermal stress applied has become small.

Besides, in working the present invention, two important physical effects attributable to porous silicon are utilized. One is the etching properties of porous silicon. Silicon is usually little wet-etched with a hydrofluoric acid solution. However, silicon can be greatly wet-etched with a hydrofluoric acid solution when the silicon is made porous. When the hydrofluoric acid solution, in particular, a mixed ethcing solution of hydrofluoric acid and aqueous hydrogen peroxide is used, the porous silicon can be etched at a rate as high as about $10^5$ times non-porous silicon. Hence, even thin silicon layers of about 1 μm thick can be selectively left uniformly and in a good controllability.

The other effect is the epitaxial growth properties. As crystal structure, porous silicon keeps a single-crystal structure, where pores of about several ten to several hundred angstroms diameter are present throughout the surface and the inside. An epitaxial layer made to grow on such a surface is characteristic of a crystallinity which is substantially the same as that of epitaxial layers formed on non-porous single-crystal substrates. In some instances, however, as a feature of epitaxial growth on porous materials, stacking faults, though in a very low density, may occur from the growth interface.

On account of the above physical properties, it becomes possible to use as an active layer a single-crystal thin film equivalent to the highly reliable epitaxial layer on the single-crystal silicon substrate, so that an SOI substrate having a crystallinity superior to conventional SOI substrates can be provided. Incidentally, the stacking fault caused during epitaxial growth are transferred to the other substrate upon bonding, and hence the stacking fault observed in the silicon layer of the resulting SOI substrate are seen in reverse.

Moreover, in the present invention, the two substrates are bonded at room temperature and then a pressure may be applied to the substrates having been brought into close contact. This makes it possible to greatly decrease the probability of causing "separation" during etching or grinding.

BRIEF DESCRIPTION OF THE DRAWINGS

FIGS. 1A to 1E illustrate Example 9 of the present invention.

DESCRIPTION OF THE PREFERRED EMBODIMENTS

The first embodiment of the present invention will be described below with reference to FIGS. 1A to 1D and FIGS. 6A and 6B.

Figure 1A:
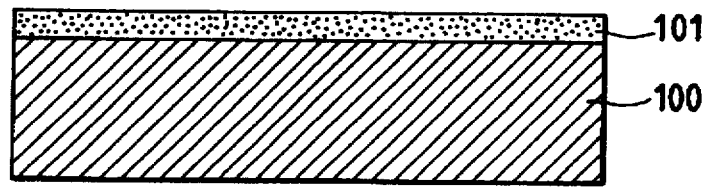
FIGS. 1A to 1D are schematic cross sectional views to illustrate the process of the present invention, and show Examples 1 and 6 of the present invention.
Figure 6A:
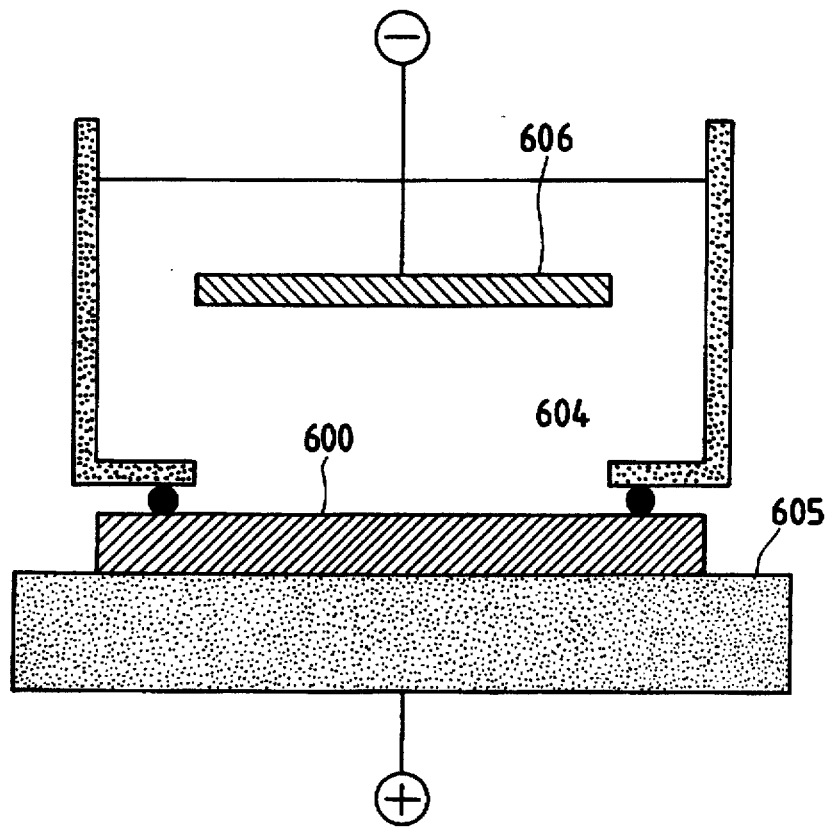
FIGS. 6A and 6B illustrate an apparatus used when the surface of the silicon substrate is made porous.
Figure 6B:
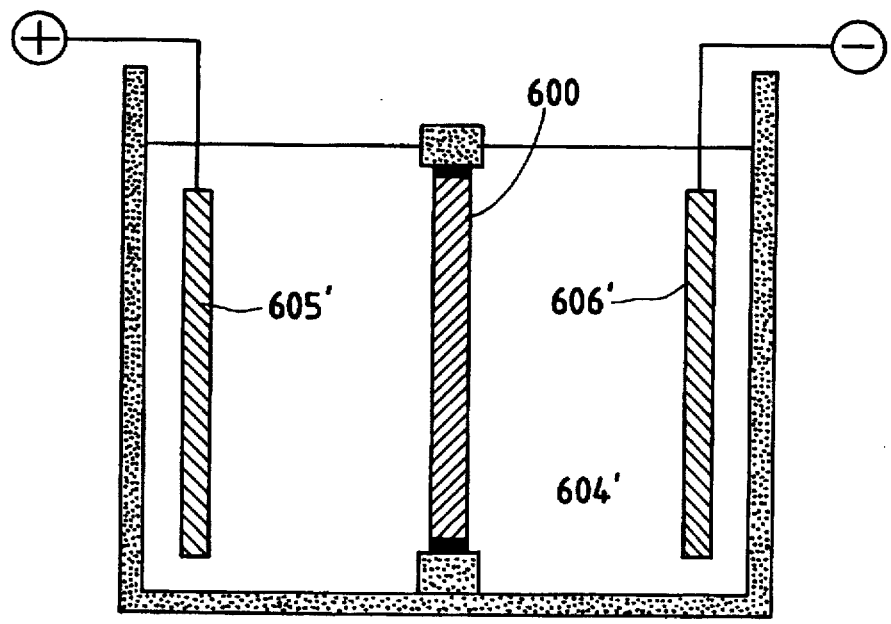

FIG. 1A: A single-crystal silicon substrate 100 is anodized to form a porous silicon layer 101. Here, the portion made porous may be in a thickness of from several μm to several ten μm as a surface layer on one side of the substrate. The whole substrate may also be anodized. How to form the porous silicon layer will be described with reference to FIGS. 6A and 6B. First, as a substrate, a p-type single-crystal silicon substrate 600 is prepared. Even an n-type one is not infeasible, but in such a case the substrate must be limited to those having a low resistance or the anodization must be carried out in the state where the formation of holes are accelerated by irradiation of the substrate surface with light. The substrate 600 is set in the apparatus as shown in FIG. 6A. More specifically, one side of the substrate comes in contact with a hydrofluoric acid type solution 604, a negative electrode 606 is taken up on the solution side, and the other side of the substrate comes in contact with a positive metal electrode 605. As shown in FIG. 6B, the positive electrode side 605' may be made to have potential through a solution 604'. In either case, the action to make the substrate porous takes place from the negative electrode side being in contact with the hydrofluoric acid type solution. As the hydrofluoric acid type solution 604, it is common to use concentrated hydrofluoric acid (49% HF). If it is diluted with pure water ($H_2O$) to a lower concentration, etching begins to take place at a certain concentration, depending on the density of current flowed, and hence it is not preferable to do so. Bubbles may also occur from the surface of the substrate 600 during anodization. For the purpose of removing such bubbles, an alcohol is added as a surface active agent as occasion calls. As the alcohol, methanol, ethanol, propanol, isopropanol or the like is used. In place of the use of a surface active agent, an agitator may be used to carry out anodization while agitating the solution. With regard to the negative electrode 606, a material that can not be corroded by the hydrofluoric acid solution is used, as exemplified by gold (Au) or platinum (Pt). The positive electrode 605 may be made of any of metal materials commonly used. Since, however, the hydrofluoric acid type solution 604 reaches the positive electrode 605 at the time the anodization has completed over the whole substrate surface, the surface of the positive electrode 605 also may preferably be covered with a metal film resistant to hydrofluoric acid solutions. The anodization may be carried out at a current density of several hundred $mA/cm^2$ at maximum. Its minimum value may take any values other than zero. This value depends on the range within which a good-quality film can be epitaxially grown on the surface of the silicon layer having been made porous. In usual cases, the rate of anodization increases with an increase in current density, and at the same time the density of the porous silicon layer decreases. In other words, the volume held by holes becomes larger. In accordance with this, the conditions for epitaxial growth change.

Figure 1B:
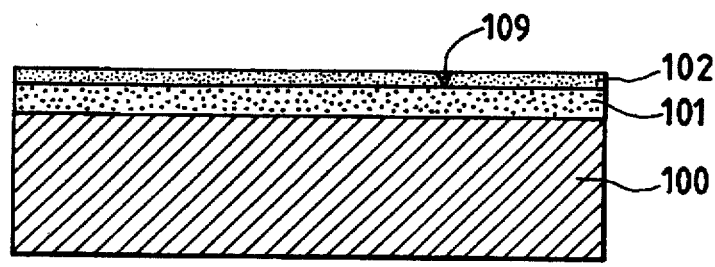

FIG. 1B: On the porous layer 101 thus formed, a non-porous single-crystal silicon layer 102 is epitaxially grown. Epitaxial growth may be carried out by commonly available thermal CVD, low pressure CVD, plasma-assisted CVD, molecular beam epitaxy or sputtering. The layer may be grown in a thickness equal to the designed value for the SOI layer, and may preferably be in a thickness not larger than 2 µm. This is because, if a single-crystal silicon layer with a thickness larger than 2 µm is in close contact with the insulator substrate mainly composed of $SiO_2$, its heating in a device fabrication process may cause a great stress at the bonding interface, due to the difference in coefficient of thermal expansion between the both materials, so that break of the silicon film, warping of the substrate, or separation at the interface may occur. So long as the layer thickness is not larger than 2 µm, the stress is relatively so small that the film break and substrate separation or warping may occur with difficulty. The layer thickness may more preferably be not larger than 0.5 µm. This is because, if the layer thickness is larger than 0.5 µm, no separation or break can occur during post-annealing but slip lines tends to occur in crystals in minute regions.

The surface of the epitaxial layer 102 may preferably have been subjected to thermal oxidation, because dangling bonds of atoms at the interface may increase if an epitaxial layer of single-crystal silicon is deposited to remain as it is. Hence, impurities tend to segregate at the bonding interface when it is directly bonded to the supporting substrate in the next step carried out in the atmosphere. Such segregation of impurities can be a factor to make thin-film device characteristics unstable.

In the epitaxial layer 102, a stacking fault 109 may sometimes occur from growth interface.

Figure 1C:
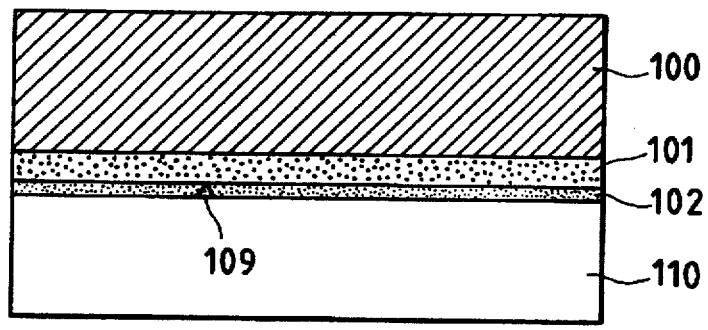

FIG. 1C: The epitaxial layer thus grown or epitaxial layer thus surface-oxidized are face-to-face bonded to the supporting substrate, an insulator substrate 110 mainly composed of $SiO_2$. This bonding is carried out after the both substrates have been cleaned with a mixed solution of hydrochloric acid and aqueous hydrogen peroxide or a mixed solution of sulfuric acid and aqueous hydrogen peroxide water. More specifically, this cleaning can make the both substrate surfaces hydrophilic, so that the bond strength attributable to van der Waals force increases through water at the bonding interface. Substrates subjected to hydrophobic cleaning with a hydrofluoric acid solution or the like can also be well bonded if they have good flatness at the bonding interface. Here, the insulator substrate 110 is available from almost all commonly available ceramics. Especially when importance is attached to its optical transparency, it is selected from molten quartz, synthetic quartz, high-melting glass and so forth.

In a process commonly used, heating at about 1,000° C. is next carried out. In the present invention, however, this is not carried out. In order to strengthen the bond between the substrates, the substrates may preferably be pressed at this stage. The pressure may be selected quite arbitrarily. For example, when a pressure of several tons to several ten tons is applied to the whole surface of 5 inch substrates, the probability of separation of the substrates during the etching or grinding step greatly decreases. The time for pressure application may be several minutes to about 1 hour.

Figure 1D:
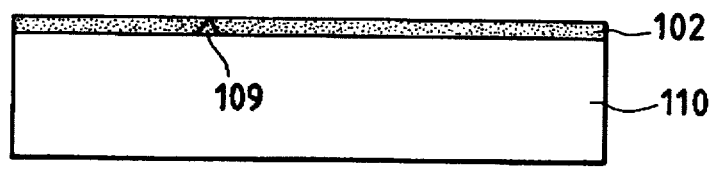

FIG. 1D: Next, leaving the epitaxially grown layer 102, the silicon substrate portion 100 and the porous silicon portion 101 are selectively removed. First, the silicon substrate portion is removed in two stages of grinding and etching. The first grinding may preferably be completed at a position where the silicon substrate have a remaining thickness of at least 100 µm, and preferably about 150 µm. Next, the remaining silicon substrate is etched with an alkali solution such as potassium hydroxide (KOH) solution or aqueous ammonia, or an organic alkali solution such as trimethyl ammonium solution. This etching is effective when carried out in a hot solution. The alkali type solution little etches $SiO_2$ components widely used in the supporting substrate, and hence can selectively etch away only the silicon portion. The silicon substrate can also be etched away with a mixed solution of hydrofluoric acid and nitric acid to which acetic acid or the like has been optionally added. However, the hydrofluoric acid-nitric acid type etchant may also more or less etch the supporting substrate, and hence its use for a long time may preferably be avoided. After the grinding and before the etching, heating at about 300° C. may be carried out. This can make defectives less occur, caused by film separation or the like in post-steps. Heating temperature depends on the materials for the insulator substrate, the diameter and thickness of the substrates, the surface properties thereof and the thickness of the remaining silicon substrate. For example, when a standard type 5 inch quartz substrate of 625 µm thick and a silicon substrate having the same diameter as the former are bonded, the substrates withstand the heating at about 300° C. in the case of a silicon remaining thickness of 150 µm. In the case of a silicon remaining thickness of 100 µm, the substrates withstand heating at about 350° to 400° C. At temperatures higher than these temperatures, separation or break may occur because of thermal stress.

At the time the silicon substrate portion 100 has been entirely etched away and the porous portion 101 has been exposed, the etching is stopped, and the remaining porous portion 101 is selectively etched in a hydrofluoric acid type solution. The non-porous, single-crystal epitaxially grown portion 102 little reacts with hydrofluoric acid, and hence remains as a thin film. The supporting substrate 110 tends, as a matter of course, to react with the hydrofluoric acid type solution since it is mainly composed of $SiO_2$, and hence it is not preferable for the substrate 110 to be immersed in the hydrofluoric acid type solution for a long time. However, when the porous silicon layer is thin, it does not take so much time for the etching, it is therefore unnecessary to care about the time. If the supporting substrate 110 should not be etched at all, a silicon nitride film or other substance that may react with hydrofluoric acid with difficulty may preferably be beforehand deposited by CVD or the like on the surface opposite to the bonding surface. Alternatively, before the substrates are immersed in the ethcing solution, the porous portion 101 may also be made thin to a certain extent using an alkali solution, an organic alkali solution or a hydrofluoric acid/nitric acid solution, whereby the time taken for the selective etching of the epitaxial layer and porous layer can be made shorter and hence the supporting substrate may also not react so much.

The hydrofluoric acid type solution used in the selective etching of the epitaxial layer 102 and porous layer 101 is comprised of a mixture of hydrofluoric acid and aqueous hydrogen peroxide ($H_2O_2$). The porous silicon can be selectively etched also using a mixed solution of hydrofluoric acid and nitric acid to which acetic acid or the like has been optionally added. In such a case, however, higher selection ratio can not be assured so much and also the single-crystal silicon thin film to be left is more or less etched. Accordingly, the etching time must be precisely controlled.

Through the foregoing steps, a single-crystal silicon thin film can be obtained on the insulator substrate. In the case when any stacking fault 109 have occurred in the layer epitaxially grown on the porous silicon layer, such a stacking fault comes to be on the insulating film 110 in reverse to usual cases upon bonding. Thereafter, when the resulting substrate is sent to a device fabrication process, heating at about 800° C. or above may preferably be carried out in order to increase the bond strength between the thin film and the substrate, or there is no problem if this heating is replaced by a heating step (for oxidation or the like) in the device fabrication process.

The second embodiment of the present invention is the same as the above first embodiment of the present invention except that the steps of removing the non-porous silicon substrate are all carried out by etching.

The third embodiment of the present invention is the same as the above second embodiment of the present invention except that the step of removing the non-porous silicon substrate is carried out by two-stage grinding, and after the first grinding a heating step is included.

In the first embodiment of the process of the present invention, the single-crystal silicon portion is first partly removed by grinding while initially the substrates can withstand the interface shear stress, and the means for removing the single-crystal silicon portion is changed for wet etching after the single-crystal silicon portion has become sufficiently thin to have a possibility of separation during the grinding. Hence, this embodiment is advantageous in that the SOI substrates can be produced without heating and also at a high speed.

In the second embodiment of the process of the present invention, the single-crystal silicon substrate is removed only by etching. Hence, the step of heating that has been indispensable when only grinding is employed can be eliminated, and the processing steps can be lessened compared with the first embodiment. Thus, this embodiment is advantageous in that so many equipments and materials need not be prepared when the process is carried out.

In the third embodiment of the present invention, the silicon substrate portion is not removed at one time but removed by two-stage grinding, so that the silicon substrate portion can be removed while heating is carried out only once between the first grinding and the second grinding. Hence, the step of wet-etching the non-porous silicon substrate portion is not required, and there is the advantage that the SOI substrates can be produced at a high speed.

As described above, the heating has been hitherto essential when conventional "bonded SOI substrates" are produced. However, in the working of the present invention, the heating is not carried out or low-temperature heating is carried out once, so that it has become possible to form SOI substrates without causing break or separation of thin films or great warpage of substrates as in the conventional bonding of substrates having coefficients of thermal expansion different from each other. At the same time, since the epitaxial growth layer enables easy control of the layer thickness distribution, the distribution of silicon layer thickness of the SOI substrates obtained by the bonding of the present invention becomes very good. Also, according to the present invention, light-transmitting SOI substrates can be produced with ease. Hence, it is possible to design functional devices utilizing such properties, and also it has become possible to provide semiconductor substrates that can substitute expensive SOS or SIMOX even for the purpose of fabricating large-scale integrated circuits of SOI structure.

EXAMPLE 1

A first example of the present invention will be described in detail with reference to FIGS. 1A to 1D and FIG. 6A.

FIG. 1A: A 5 inch p-type (100) single-crystal silicon substrate (0.1 to 0.2 Ω·cm) having a thickness of 625 µm was prepared. This substrate was set in the apparatus as shown in FIG. 6A, and was anodized to make the surface of the silicon substrate 100 into porous silicon 101 by a thickness of 20 µm. In this step, the solution 604 used was a 49% HF solution and the current density was 100 mA/cm$^2$. Also in this step the substrate surface was made porous at a rate of 8.4 µm/min and the porous layer of 20 µm thick was obtained in about 2.5 minutes.

FIG. 1B: On the porous silicon 101, the single-crystal silicon layer 102 was epitaxially grown by CVD in a thickness of 0.5 µm. The CVD was carried out under the following conditions.
Gas used: SiH$_4$/H$_2$
Gas flow rate: 0.42/140 (lit/min)
Temperature: 750° C.
Pressure: 80 Torr
Growth rate: 0.08 µm/min In this step, a stacking fault 109 occurred.

FIG. 1C: The substrate produced in the manner as described above was cleaned with a mixed solution of hydrochloric acid, aqueous hydrogen peroxide and water, and then rinsed with pure water, followed by drying. Thereafter, at room temperature this substrate was brought into close contact with a 5 inch molten quartz substrate 110 having been cleaned in the same way.

FIG. 1D: Using a surface grinder, the bonded substrate thus obtained was first ground down on its side of the silicon substrate by 475 µm so as for the silicon substrate to have a remaining thickness of about 150 µm (single-crystal substrate portion: 130 µm; porous silicon portion: 20 µm; epitaxial layer portion: 0.5 µm). Subsequently, the resulting substrate was immersed in an undiluted solution of a commercially available developer SD-1 (produced by Tokuyama Soda Co., Ltd.; an aqueous tetramethylammonium hydroxide solution), and kept immersed for 140 minutes at a temperature of 85° to 90° C. As a result, the quartz substrate 110 was little etched but the silicon substrate 100 of about 130 µm thick was entirely etched away, and the porous silicon layer 101 was exposed while being etched in a depth of about 10 µm. The resulting substrate was successively immersed in a selective etching solution to selectively etch only the porous portion 101 in its entirety. In this etching, the composition of the selective etching solution and the etching rate on the porous silicon was respectively as follows:

HF:H$_2$O$_2$=1:5; 1.6 µm/min.

Thus, the porous portion of 10 µm thick was entirely etched away in about 7 minutes. By the way, during this etching, the single-crystal silicon layer 102 was only etched at a rate of 0.0006 µm/hour, and remained little etched. As for the quartz substrate 110, its etching rate in the above ethcing solution was about 0.5 µm/min, and it follows that the quartz substrate was etched in a depth of about 4 µm during the etching. Since the original thickness of the quartz substrate was 625 µm, it follows that the thickness decreased to about 621 µm.

As a result, an SOI substrate comprising a transparent substrate having thereon a 0.5 µm thick single-crystal silicon thin film was obtained. The stacking fault 109 came into being in reverse on the transparent substrate. This substrate was annealed in an atmosphere of nitrogen at 1,000° C. for 1 hour to carry out heating to enhance the bond strength at the bonding interface. The annealing caused none of cracks, slip lines and so forth in the single-crystal silicon film.

EXAMPLE 2

A second example of the present invention will be described in detail with reference to FIGS. 2A to 2E.

Figure 2A:
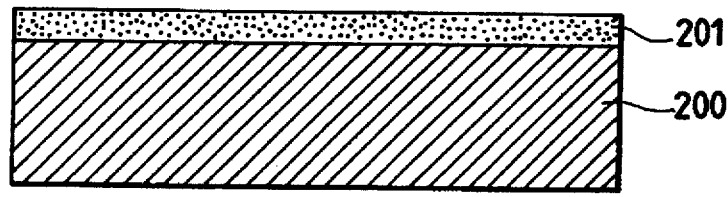
FIGS. 2A to 2E illustrate Examples 2 and 7 of the present invention.

FIG. 2A: A 4 inch p-type (100) single-crystal silicon substrate 200 with a resistivity of 0.01 $\Omega$·cm, having a thickness of 300 µm was prepared. This substrate was anodized in the same manner as in Example 1 to make its surface into porous silicon 201 by a thickness of 20 µm.

Figure 2B:
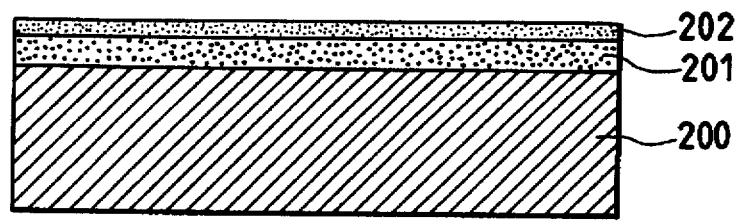

FIG. 2B: On the surface of the porous layer thus formed, an epitaxial layer 202 was formed in a thickness of 0.5 µm in the same manner as in Example 1.

Figure 2C:
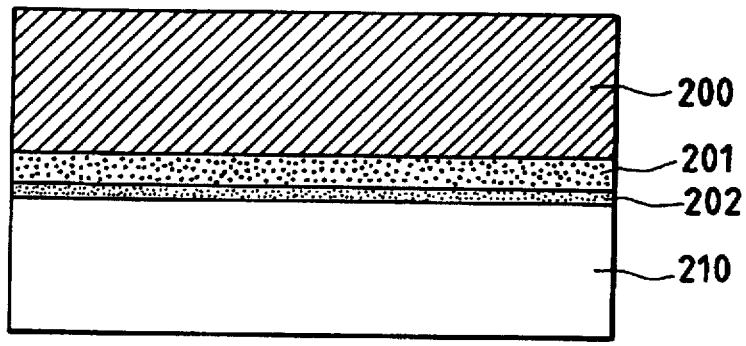

FIG. 2C: The substrate obtained in the manner describe above was cleaned with a 1:40 mixed solution of hydrofluoric acid and water, and then rinsed with pure water, followed by drying. Thereafter, at room temperature this substrate was brought into close contact with a 4 inch molten quartz substrate 210 having been cleaned in the same way. Then, using a pressing machine, a pressure of 60 tons was applied to the whole surface of the 4 inch substrate, and kept pressed for 10 minutes.

Figure 2D:

FIG. 2D: Using a surface grinder, the silicon substrate portion 200 having a thickness of 280 µm was first ground down to have a remaining thickness of about 100 µm (single-crystal silicon portion: 80 µm; porous silicon portion: 20 µm; epitaxial layer portion: 0.5 µm). Subsequently, the resulting substrate was etched with a 1:10:10 mixed solution of hydrofluoric acid, nitric acid and acetic acid. Then, at the time the porous silicon layer 201 was exposed to the surface, the porous silicon layer 201 was selectivly etched with a 1:5 mixed solution of hydrofluoric acid and aqueous hydrogen peroxide. At this stage, the etching rate of the hydrofluoric acid/nitric acid/acetic acid solution on the single-crystal silicon was about 2 µm/min and the etching rate of the hydrofluoric acid/aqueous hydrogen peroxide solution was about 1.6 µm/min on the porous silicon. Hence, it was possible to entirely etch away the single-crystal silicon in about 40 minutes and the porous silicon in about 13 minutes. The quartz substrate 210 was only etched in a depth of several µm and remained unetched any longer.

Figure 2E:
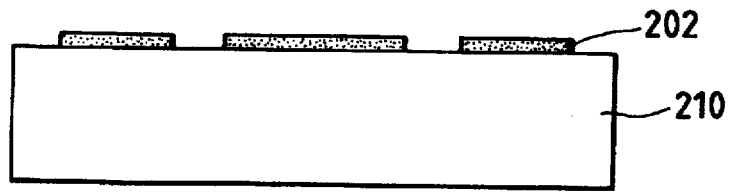

FIG. 2E: The single-crystal silicon thin film on the quartz substrate 210, obtained through the foregoing steps, was patterned in an island form in accordance with the area, form and arrangement of designed devices. For example, at the position where an MOS transistor with a channel length and a channel width of 2 µm and 4 µm, respectively, an island of 4×10 µm² including source and drain regions was patterned at the designed position.

After the patterning, the substrate was heated at 1,000° C. for 2 hours. Thus, an SOI substrate comprising a transparent substrate having thereon a 0.5 µm thick single-crystal silicon thin film was obtained.

EXAMPLE 3

A third example of the present invention will be described in detail with reference to FIGS. 3A to 3E.

Figure 3A:
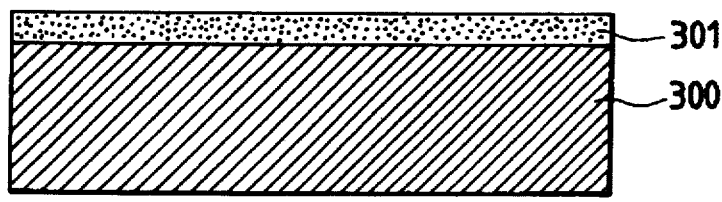
FIGS. 3A to 3E illustrate Examples 3, 8 and 11 of the present invention.

FIG. 3A: A 5 inch p-type (100) single-crystal silicon substrate 300 with a resistivity of 0.01 $\Omega$·cm, having a thickness of 400 µm was prepared. This substrate was anodized to form a porous layer 301 thereon by a thickness of 20 µm from its surface.

Figure 3B:
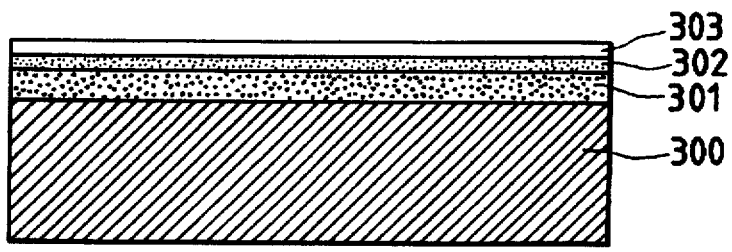

FIG. 3B: On the surface of the porous layer on the substrate thus obtained, an epitaxial layer 302 was formed in a thickness of 0.5 µm in the same manner as in Example 1. The surface of the epitaxial layer 302 on the same substrate was then oxidized in a depth of 0.2 µm in water vapor of 1,000° C. to form an SiO$_2$ layer 303. As a result, the epitaxial layer had a single-crystal silicon portion and an oxide film portion in layer thicknesses of 0.4 µm and 0.2 µm, respectively.

Figure 3C:
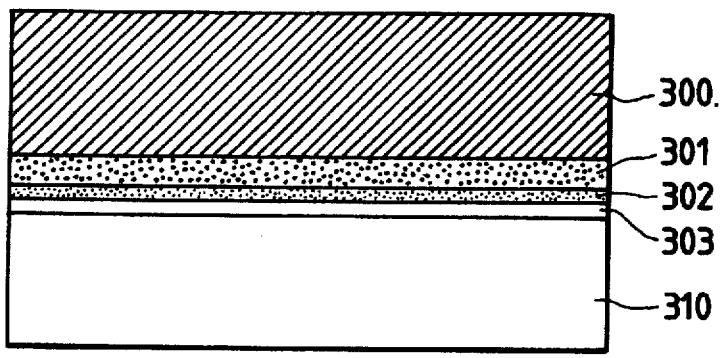

FIG. 3C: The substrate obtained in the manner describe above was cleaned with a mixed solution of hydrochloric acid, aqueous hydrogen peroxide and water, and then rinsed with pure water, followed by drying. Thereafter, at room temperature this substrate was brought into close contact with a 5 inch molten quartz substrate 310 having been cleaned in the same way.

Figure 3D:
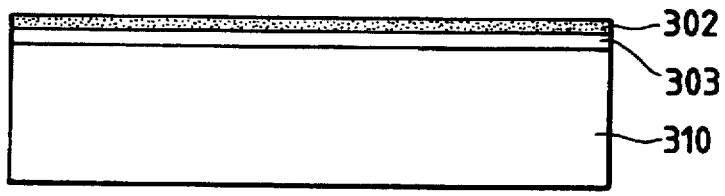

FIG. 3D: Using a surface grinder, the silicon substrate portion was first ground down by 230 µm in the same manner as in Example 1 so as to have a remaining thickness of 150 µm, and thereafter the silicon substrate portion 300 was entirely etched away with SD-1 to expose the porous portion 301. Subsequently, the porous portion 301 was selectively etched with a solution of hydrofluoric acid/ aqueous hydrogen peroxide.

Figure 3E:
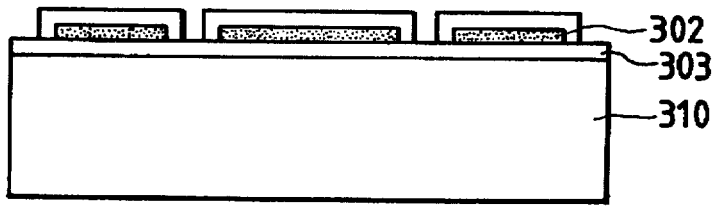

FIG. 3E: The single-crystal silicon thin film 302 on the quartz substrate 310, obtained through the foregoing steps, was patterned in a form of islands in accordance with the area, shape and arrangement of designed devices, in the same manner as in Example 2.

After the patterning, as a first step of device fabrication, the respective island regions were oxidized in a depth of 0.05 µm in an atmosphere of oxygen at 1,000° C. Thus, this oxidizing step was used also as the heating of the substrate at the same time. As a result, an SOI substrate comprising a transparent substrate having thereon a 0.4 µm thick single-crystal silicon thin film was obtained.

EXAMPLE 4

A fourth example of the present invention will be described in detail with reference to FIGS. 4A to 4E.

Figure 4A:
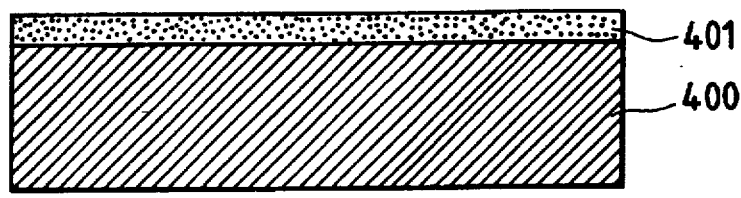
FIGS. 4A to 4E illustrate Example 4 of the present invention.

FIG. 4A: A 5 inch p-type (100) single-crystal silicon substrate 400 with a resistivity of 0.01 $\Omega$·cm, having a thickness of 600 µm was prepared. This substrate was anodized to form a porous layer 401 thereon by a thickness of 20 µm from its surface.

Figure 4B:
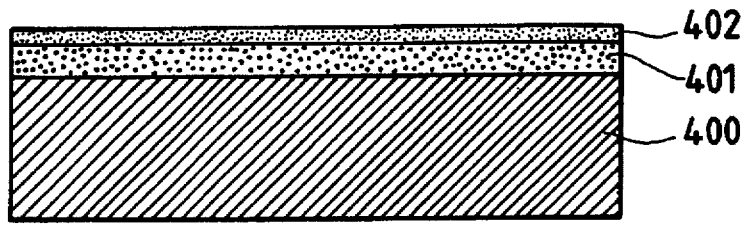

FIG. 4B: On the surface of the porous layer on the substrate thus obtained, an epitaxial layer 402 was formed in a thickness of 0.5 µm in the same manner as in Example 1.

Figure 4C:
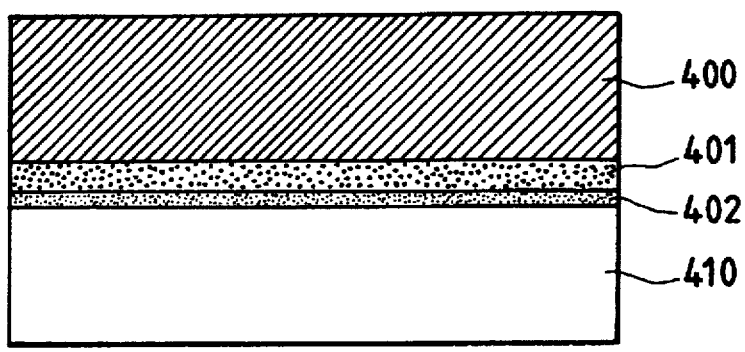

FIG. 4C: The substrate obtained in the manner describe above was cleaned with a mixed solution of hydrochloric acid, aqueous hydrogen peroxide and water, and then rinsed with pure water, followed by drying. Thereafter, at room temperature this substrate was brought into close contact with a 5 inch molten quartz substrate 410 having been cleaned in the same way.

Figure 4D:
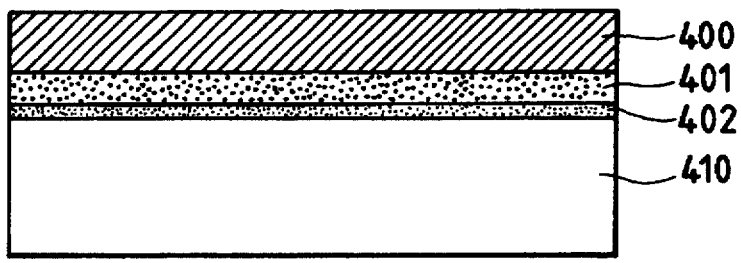

FIG. 4D: Using a surface grinder, the silicon substrate portion 400 was ground down so as to have a remaining thickness of 150 µm. The substrate thus obtained was heated at 300° C. for 24 hours.

Figure 4E:

FIG. 4E: Thereafter, the silicon substrate portion 400 was entirely etched away with SD-1 in the same manner as in Example 1, and then the porous portion 401 was selectively etched with an aqueous hydrofluoric acid/hydrogen peroxide solution.

Through the foregoing steps, an SOI substrate comprising the quartz substrate 410 having thereon a single-crystal silicon thin film was obtained.

EXAMPLE 5

A fifth example of the present invention will be described in detail with reference to FIGS. 5A to 5F.

Figure 5A:
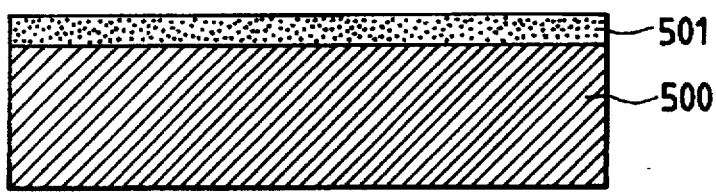
FIGS. 5A to 5F illustrate Example 5 of the present invention.

FIG. 5A: A 5 inch p-type (100) single-crystal silicon substrate 500 with a resistivity of 0.01 Ω·cm, having a thickness of 600 μm was prepared. This substrate was anodized to form a porous layer 501 thereon by a thickness of 20 μm from its surface.

Figure 5B:
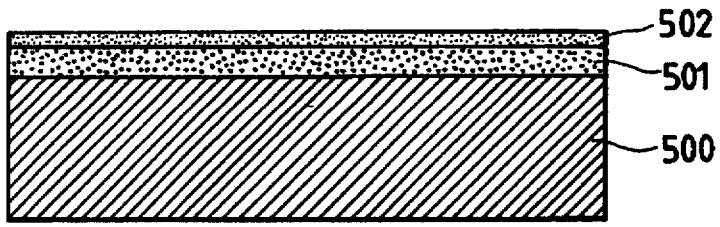

FIG. 5B: On the surface of the porous layer on the substrate thus obtained, an epitaxial layer 502 was formed in a thickness of 0.5 μm in the same manner as in Example 1.

Figure 5C:
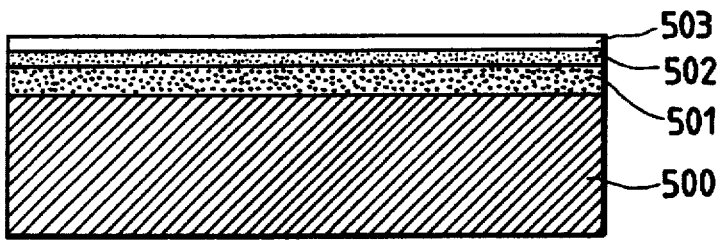

FIG. 5C: The surface of the epitaxial layer 502 was oxidized to form a 0.1 μm thick $SiO_2$ layer 503.

Figure 5D:
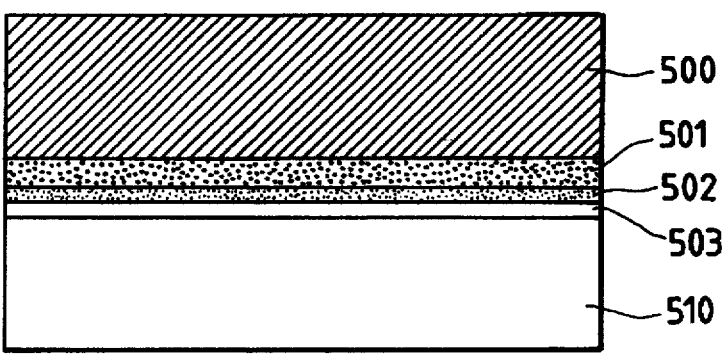

FIG. 5D: The substrate thus obtained was cleaned with a mixed solution of hydrochloric acid, aqueous hydrogen peroxide and water, and then rinsed with pure water, followed by drying. Thereafter, at room temperature this substrate was brought into close contact with a 5 inch molten quartz substrate 510 having been cleaned in the same way.

The substrates brought into close contact were further pressed at a pressure of 20 tons for 5 minutes.

Figure 5E:
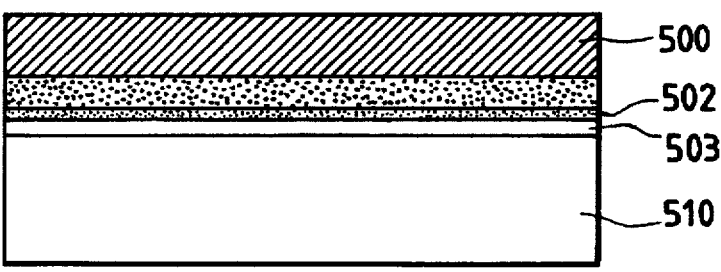

FIG. 5E: Using a surface grinder, the silicon substrate portion 500 was ground down so as to have a remaining thickness of 150 μm.

Figure 5F:
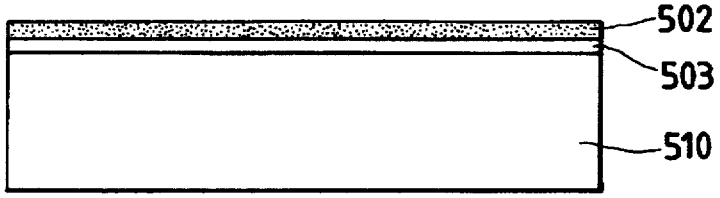

FIG. 5F: Here, heating was carried out at 300° C. for 10 hours, and then the remaining silicon substrate portion 500 was etched with SD-1 in the same manner as in Example 1 to entirely remove the silicon substrate portion.

Thereafter, the porous portion 501 was selectively etched with an aqueous hydrofluoric acid/aqueous hydrogen peroxide solution in the same manner as in Example 1.

Through the foregoing steps, a semiconductor substrate comprising the quartz substrate 510 having thereon a single-crystal silicon thin film was obtained through only one-time heating.

EXAMPLE 6

A sixth example of the present invention will be described in detail with reference to FIGS. 1A to 1D and FIG. 6A.

FIG. 1A: A 5 inch p-type (100) single-crystal silicon substrate (0.1 to 0.2 Ω·cm) having a thickness of 625 μm was prepared. This substrate was set in the apparatus as shown in FIG. 6A, and was anodized to make the surface of the silicon substrate 100 into porous silicon 101 by a thickness of 20 μm. In this step, the solution 604 used was a 49% HF solution and the current density was 100 mA/cm². Also, in this step the substrate surface was made porous at a rate of 8.4 μm/min and the porous layer of 20 μm thick was obtained in about 2.5 minutes.

FIG. 1B: On the porous silicon 101, the single-crystal silicon layer 102 was epitaxially grown by CVD in a thickness of 0.5 μm. The CVD was carried out under the following conditions.
Gas used: $SiH_4/H_2$
Gas flow rate: 0.62/140 (lit/min)
Temperature: 750° C.
Pressure: 80 Torr
Growth rate: 0.12 μm/min In this step, a stacking fault 109 occurred.

FIG. 1C: The substrate produced in the manner as described above was cleaned with a mixed solution of hydrochloric acid, aqueous hydrogen peroxide and water, and then rinsed with pure water, followed by drying. Thereafter, at room temperature this substrate was brought into close contact with a 5 inch molten quartz substrate 110 having been cleaned in the same way.

FIG. 1D: The bonded substrate thus obtained was first immersed in an undiluted solution of a commercially available developer SD-1 (produced by Tokuyama Soda Co., Ltd.; an aqueous tetramethylammonium hydroxide solution), and kept immersed for 10 hours at a temperature of 85° to 90° C. As a result, the quartz substrate 110 was little etched but the silicon substrate 100 of about 600 μm thick was entirely etched away to expose the porous silicon layer 101. The resulting substrate was successively immersed in a selective etching solution to selectively etch only the porous portion 101 in its entirety. In this etching, the composition of the selective etching solution and the etching rate on the porous silicon was respectively as follows:

$HF:H_2O_2=1:5$; 1.6 μm/min.

Thus, the porous portion of 20 μm thick was entirely etched away in about 13 minutes. By the way, during this etching, the single-crystal silicon layer 102 was only etched at a rate of 0.0006 μm/hour, and remained little etched. As for the quartz substrate 110, its etching rate in the above ethcing solution was about 0.5 μm/min, and it follows that the quartz substrate was etched in a depth of about 7 μm during the etching. Since the original thickness of the quartz substrate was 625 μm, it follows that the thickness decreased to about 618 μm.

As a result, an SOI substrate comprising a transparent substrate having thereon a 0.5 μm thick single-crystal silicon thin film was obtained. The stacking fault 109 came into being in reverse on the transparent substrate. This SOI substrate was annealed in an atmosphere of nitrogen at 1,000° C. for 1 hour to carry out heating to enhance the bond strength at the bonding interface. The annealing caused none of cracks, slip lines and so forth in the single-crystal silicon film.

EXAMPLE 7

A seventh example of the present invention will be described in detail with reference to FIGS. 2A to 2E.

FIG. 2A: A 4 inch p-type (100) single-crystal silicon substrate 200 with a resistivity of 0.01 Ω·cm, having a thickness of 300 μm was prepared. This substrate was anodized in the same manner as in Example 1 to make its surface into porous silicon 201 by a thickness of 20 μm.

FIG. 2B: On the surface of the porous layer thus formed, an epitaxial layer 202 was formed in a thickness of 0.5 μm in the same manner as in Example 1.

FIG. 2C: The substrate obtained in the manner describe above was cleaned with a mixed solution of hydrochloric acid, aqueous hydrogen peroxide and water, and then rinsed with pure water, followed by drying. Thereafter, at room temperature this substrate was brought into close contact with a 4 inch molten quartz substrate 210 having been cleaned in the same way.

FIG. 2D: The silicon substrate portion 200 having a thickness of 280 μm was first etched with a 1:10:10 mixed solution of hydrofluoric acid, nitric acid and acetic acid. Then, at the time the porous silicon layer 201 was exposed to the surface, the porous silicon layer 201 was selective etched with a 1:5 mixed solution of hydrofluoric acid and aqueous hydrogen peroxide. At this stage, the etching rate of the hydrofluoric acid/nitric acid/acetic acid solution on the single-crystal silicon was about 2 μm/min and the etching rate of the hydrofluoric acid/aqueous hydrogen peroxide solution was about 1.6 μm/min on the porous silicon. Hence, it was possible to entirely etch away the single-crystal silicon in about 140 minutes and the porous silicon in about 13 minutes. The quartz substrate 210 was only etched in a depth of several μm and remained unetched any longer.

FIG. 2E: The single-crystal silicon thin film on the quartz substrate 210, obtained through the foregoing steps, was patterned in an island form in accordance with the area, shape and arrangement of designed devices. For example, at the position where an MOS transistor with a channel length and a channel width of 2 μm and 4 μm, respectively, an island of 4×10 μm² including source and drain regions was patterned at the designed position.

After the patterning, the substrate was heated at 1,000° C. for 2 hours. Thus, an SOI substrate comprising a transparent substrate having thereon a 0.5 μm thick single-crystal silicon thin film was obtained.

EXAMPLE 8

An eighth example of the present invention will be described in detail with reference to FIGS. 3A to 3E.

FIG. 3A: A 5 inch p-type (100) single-crystal silicon substrate 300 with a resistivity of 0.01 Ω·cm, having a thickness of 400 μm was prepared. This substrate was anodized to form a porous layer 301 thereon by a thickness of 20 μm from its surface.

FIG. 3B: On the surface of the porous layer on the substrate thus obtained, an epitaxial layer 302 was formed in a thickness of 0.5 μm in the same manner as in Example 1. The surface of the epitaxial layer 302 on the same substrate was then oxidized in a depth of 0.2 μm in water vapor of 1,000° C. to form an SiO₂ layer 303. As a result, the epitaxial layer had a single-crystal silicon portion and an oxide film portion in layer thicknesses of 0.4 μm and 0.2 μm, respectively.

FIG. 3C: The substrate obtained in the manner describe above was cleaned with a diluted hydrofluoric acid solution, and then rinsed with pure water, followed by drying. Thereafter, at room temperature this substrate was brought into close contact with a 5 inch synthetic quartz substrate 310 having been cleaned in the same way.

FIG. 3D: The silicon substrate portion 300 was entirely etched with SD-1 in the same manner as in Example 1, and thereafter the porous portion 301 was selectively etched with an aqueous hydrofluoric acid/hydrogen peroxide solution.

FIG. 3E: The single-crystal silicon thin film 302 on the quartz substrate 310, obtained through the foregoing steps, was patterned in an island form in accordance with the area, shape and arrangement of designed devices, in the same manner as in Example 1.

After the patterning, as a first step of device fabrication, the respective island regions were oxidized in a depth of 0.05 μm in an atmosphere of oxygen at 1,000° C. Thus, this oxidizing step was used also as the heating step of the substrate at the same time. As a result, an SOI substrate comprising a transparent substrate having thereon about 0.4 μm thick single-crystal silicon thin film was obtained.

EXAMPLE 9

A ninth example of the present invention will be described in detail with reference to FIG. 6A and FIGS. 7A to 7E.

Figure 7A:
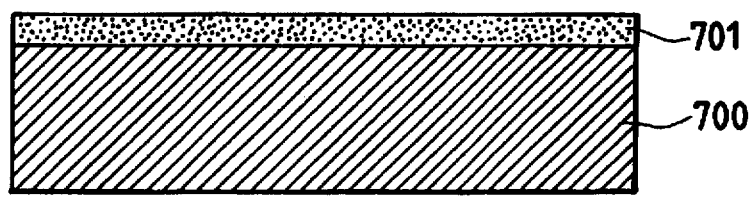

FIG. 7A: A 5 inch p-type (100) single-crystal silicon substrate (0.1 to 0.2 Ω·cm) having a thickness of 628 μm was prepared. This substrate was set in the apparatus as shown in FIG. 6A, and was anodized to make the surface of the silicon substrate 700 into porous silicon 701 by a thickness of 20 μm. In this step, the solution 604 used was a 49% HF solution and the current density was 100 mA/cm². Also, in this step the substrate surface was made porous at a rate of 8.4 μm/min and the porous layer of 20 μm thick was obtained in about 2.5 minutes.

Figure 7B:
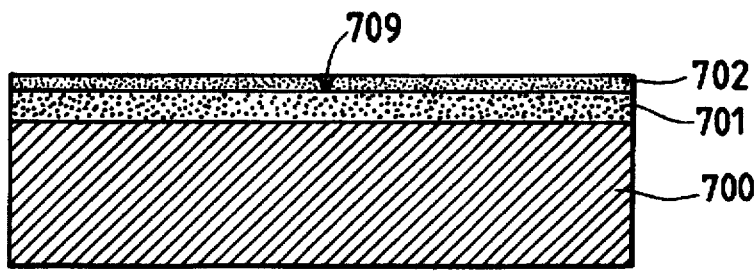

FIG. 7B: On the porous silicon 701, the single-crystal silicon layer 702 was epitaxially grown by CVD in a thickness of 0.5 μm. The CVD was carried out under the following conditions.
Gas used: SiH₄/H₂
Gas flow rate: 0.42/140 (lit/min)
Temperature: 750° C.
Pressure: 80 Torr
Growth rate: 0.08 μm/min In this step, a stacking fault 709 occurred.

Figure 7C:
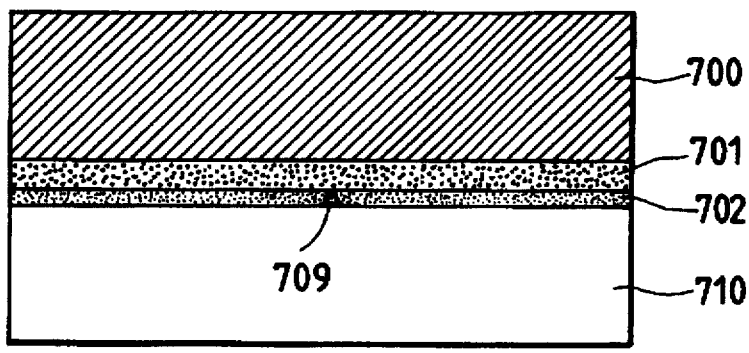

FIG. 7C: The substrate produced in the manner as described above was cleaned with a mixed solution of hydrochloric acid, aqueous hydrogen peroxide and water, and then rinsed with pure water, followed by drying. Thereafter, at room temperature this substrate was brought into close contact with a 5 inch molten quartz substrate 710 having been cleaned in the same way.

Figure 7D:
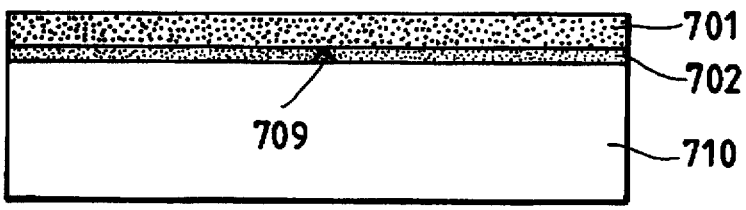

FIG. 7D: Using a surface grinder, the bonded substrate thus obtained was ground down on its side of the silicon substrate by 475 μm so as for the silicon substrate to have a remaining thickness of about 150 μm (single-crystal substrate portion: 130 μm; porous silicon portion: 20 μm; epitaxial layer portion: 0.5 μm). At this stage, the above substrate was heated at 300° C. for 24 hours, and subsequently, the remaining silicon portion of 130 μm was removed by grinding.

Figure 7E:
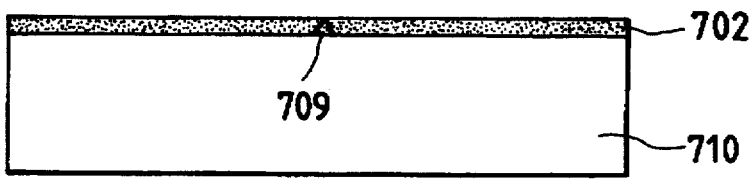

FIG. 7E: The resulting substrate on which the porous layer 701 was exposed was successively immersed in a selective etching solution to selectively etch only the porous portion 701 in its entirety. In this etching, the composition of the selective etching solution and the etching rate on the porous silicon was respectively as follows:

$HF:H_2O_2=1:5$; 1.6 μ/min.

Thus, the porous portion of 20 μm thick was entirely etched away in about 13 minutes. By the way, during this etching, the single-crystal silicon layer 502 was only etched at a rate of 0.0006 μm/hour, and remained little etched. As for the quartz substrate 510, its etching rate in the above ethcing solution was about 0.5 μm/min, and it follows that the quartz substrate was etched in a depth of about 7 μm during the etching. Since the original thickness of the quartz substrate was 625 μm, it follows that the thickness decreased to about 618 μm.

As a result, an SOI substrate comprising a transparent substrate having thereon a 0.5 μm thick single-crystal silicon thin film was obtained. The stacking fault 709 came into being in reverse on the transparent substrate. This SOI substrate was annealed in an atmosphere of nitrogen at 1,000° C. for 1 hour to carry out heating to enhance the bond strength at the bonding interface. The annealing caused none of cracks, slip lines and so forth in the single-crystal silicon film.

EXAMPLE 10

A tenth example of the present invention will be described in detail with reference to FIGS. 8A to 8E.

Figure 8A:
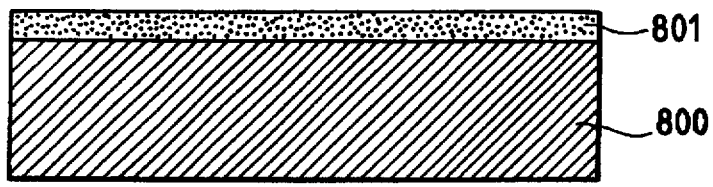
FIGS. 8A to 8E illustrate Example 10 of the present invention.

FIG. 8A: A 4 inch p-type (100) single-crystal silicon substrate 800 with a resistivity of 0.01 Ω·cm, having a thickness of 300 μm was prepared. This substrate was anodized in the same manner as in Example 1 to make its surface into porous silicon 801 by a thickness of 20 μm.

Figure 8B:
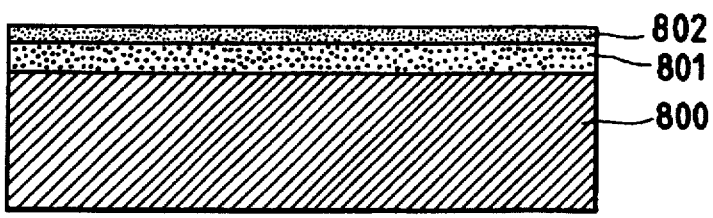

FIG. 8B: On the surface of the porous layer thus formed, an epitaxial layer 802 was formed in a thickness of 0.5 μm in the same manner as in Example 1.

Figure 8C:
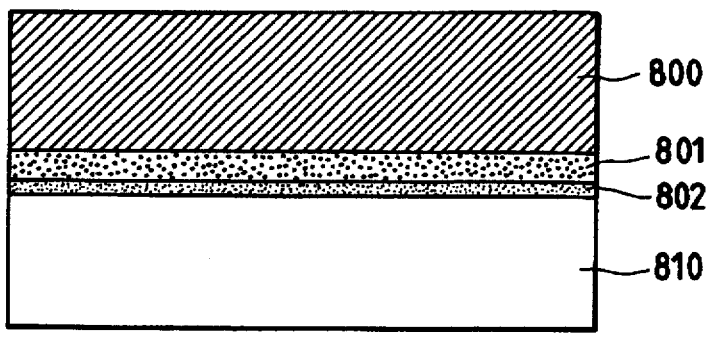

FIG. 8C: The substrate obtained in the manner described above was cleaned with a 1:40 mixed solution of hydrofluoric acid and water, and then rinsed with pure water, followed by drying. Thereafter, at room temperature this substrate was brought into close contact with a 4 inch molten quartz substrate 810 having been cleaned in the same way. Then, using a pressing machine, a pressure of 60 tons was applied to the whole surface of the 4 inch substrate, and kept pressed for 10 minutes.

Figure 8D:
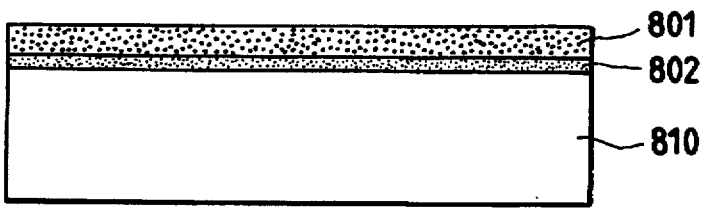

FIG. 8D: Using a surface grinder, the silicon substrate portion 800 having a thickness of 280 μm was first ground down by 180 μm to have a remaining thickness of about 100 μm (single-crystal silicon portion: 80 μm; porous silicon portion: 20 μm; epitaxial layer portion: 0.5 μm). Subsequently, this substrate was heated at 300° C. for 10 hours, and grinding was again carried out to remove the remaining silicon substrate portion of 80 μm.

Figure 8E:

FIG. 8E: At the time the porous silicon layer 801 was exposed to the surface, the substrate was immersed in a 1:5 mixed solution of hydrofluoric acid and aqueous hydrogen peroxide to carry out selective etching. The etching rate of the hydrofluoric acid/aqueous hydrogen peroxide was about 1.6 μm/min on the porous silicon. Hence, it was possible to entirely etch away the porous silicon in about 13 minutes. The quartz substrate 810 was only etched in a depth of several μm and remained unetched any longer.

The single-crystal silicon thin film 802 on the quartz substrate 810, obtained through the foregoing steps, was patterned in an island form in accordance with the area, shape and arrangement of designed devices. For example, at the position where an MOS transistor with a channel length and a channel width of 2 μm and 4 μm, respectively, an island of 4×10$^{\mu m 2}$ including source and drain regions was patterned at the designed position.

After the patterning, the substrate was heated at 1,000° C. for 2 hours. Thus, an SOI substrate comprising a transparent substrate having thereon a 0.5 μm thick single-crystal silicon thin film was obtained.

EXAMPLE 11

An eleventh example of the present invention will be described in detail with reference to FIGS. 3A to 3E.

FIG. 3A: A 5 inch p-type (100) single-crystal silicon substrate 300 with a resistivity of 0.01 Ω-cm, having a thickness of 400 μm was prepared. This substrate was anodized to form a porous layer 301 thereon by a thickness of 20 μm from its surface.

FIG. 3B: On the surface of the porous layer on the substrate thus obtained, an epitaxial layer 302 was formed in a thickness of 0.5 μm in the same manner as in Example 1. The surface of the epitaxial layer 302 on the same substrate was then oxidized in a depth of 0.2 μm in water vapor of 1,000° C. to form an SiO$_2$ layer 303. As a result, the epitaxial layer had a single-crystal silicon portion and an oxide film portion in layer thicknesses of 0.4 μm and 0.2 μm, respectively.

FIG. 3C: The substrate obtained in the manner describe above was cleaned with a mixed solution of hydrochloric acid, aqueous hydrogen peroxide and water, and then rinsed with pure water, followed by drying. Thereafter, at room temperature this substrate was brought into close contact with a 5 inch molten quartz substrate 310 having been cleaned in the same way.

FIG. 3D: Using a surface grinder, the silicon substrate portion was first ground down by 230 μm in the same manner as in Example 1 so as to have a remaining thickness of 150 μm, and thereafter heated at 300° C. for 24 hours. Subsequently, the remaining silicon substrate portion 300 was entirely removed by grinding to expose the porous portion 301. Subsequently, the porous portion 301 thus exposed was selectively etched with an aqueous hydrofluoric acid/aqueous hydrogen peroxide solution.

FIG. 3E: The single-crystal silicon thin film 302 on the quartz substrate 310, obtained through the foregoing steps, was patterned in an island form in accordance with the area, form and arrangement of designed devices, in the same manner as in Example 2.

After the patterning, as a first step of device fabrication, the respective island regions were oxidized in a depth of 0.05 μm in an atmosphere of oxygen at 1,000° C. Thus, this oxidizing step was used also as the heating step of the substrate at the same time. As a result, an SOI substrate comprising a transparent substrate having thereon about 0.4 μm thick single-crystal silicon thin film was obtained.

EXAMPLE 12

A twelfth example of the present invention will be described in detail with reference to FIGS. 9A to 9D.

Figure 9A:
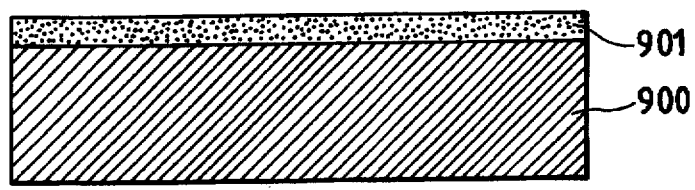
FIGS. 9A to 9D illustrate Example 12 of the present invention.

FIG. 9A: A 5 inch p-type (100) single-crystal silicon substrate with a resistivity of 0.1 Ω-cm, having a thickness of 600 μm was prepared. This substrate was anodized to form a porous layer 901 thereon by a thickness of 20 μm from its surface.

Figure 9B:
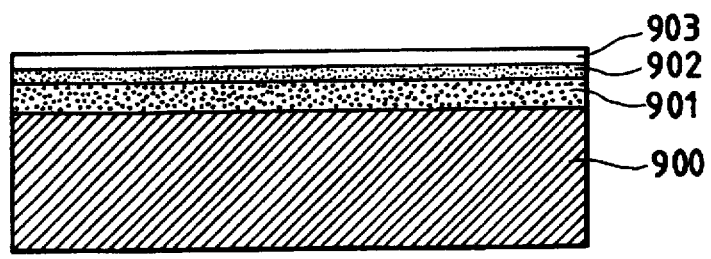

FIG. 9B: On the surface of the porous layer on the substrate thus obtained, an epitaxial layer 902 was formed in a thickness of 0.5 μm in the same manner as in Example 1. Subsequently, the surface of the epitaxial layer 902 was oxidized to form an SiO$_2$ layer 903 of 0.1 μm thick.

Figure 9C:
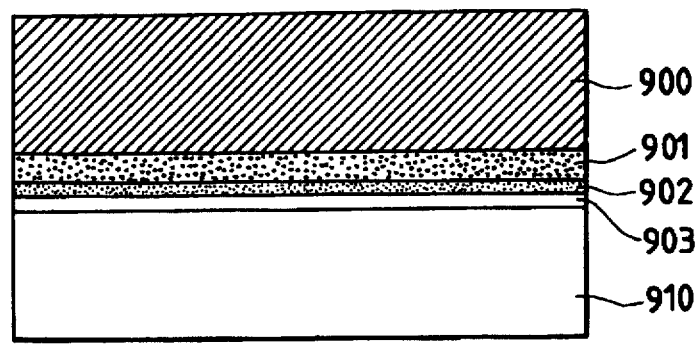

FIG. 9C: The substrate thus obtained was cleaned with a mixed solution of hydrochloric acid, aqueous hydrogen peroxide and water, and then rinsed with pure water, followed by drying. Thereafter, at room temperature this substrate was brought into close contact with a 5 inch molten quartz substrate 910 having been cleaned in the same way.

The substrates brought into close contact were further pressed at a pressure of 20 tons for 5 minutes.

Figure 9D:
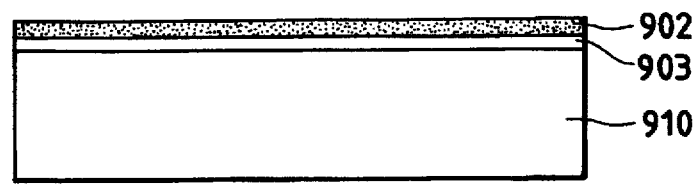
Figure 10:
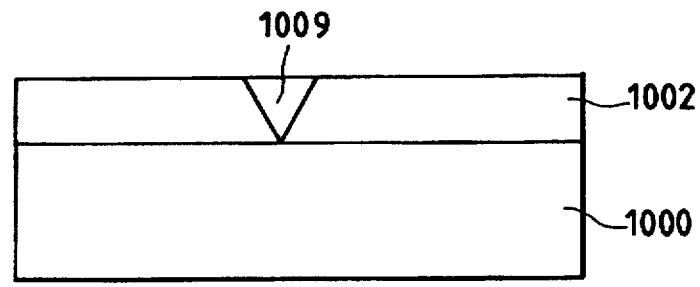
FIG. 10 illustrates growth of a stacking fault.

FIG. 9D: Using a surface grinder, the silicon substrate portion 900 was ground down so as to have a remaining thickness of about 150 μm.

FIG. 9E: Here, the resulting substrate was heated at 300° C. for 10 hours, and subsequently the remaining silicon substrate portion was ground down to entirely remove the silicon subs/rate portion.

Thereafter, the porous portion 901 was selectively etched with an aqueous hydrofluoric acid/aqueous hydrogen peroxide solution in the same manner as in Example 1.

Through the foregoing steps, a semiconductor substrate comprising the quartz substrate 910 having thereon a single-crystal silicon thin film was obtained through only one-time heating.

What is claimed is:

1. A process for producing a semiconductor substrate, comprising successively the steps of:

a) anodizing a surface layer on one side of a single-crystal semiconductor substrate to make the surface layer porous to form a porous single-crystal semiconductor layer on a non-porous single-crystal semiconductor region;

b) expitaxially growing a non-porous single-crystal semiconductor layer on said porous single-crystal semiconductor layer;

c) bringing the surface of said non-porous single-crystal semiconductor layer into close contact with the surface of an insulator substrate and then bonding both to each other without heating;

d) grinding down said non-porous single-crystal semiconductor region to remove part of said non-porous single-crystal semiconductor region;

e) heating the whole to strengthen the bond between said non-porous single-crystal semiconductor layer and said insulator substrate;

f) etching said non-porous single-crystal semiconductor region remaining after the grinding step d), to entirely remove said non-porous single-crystal semiconductor region to expose said porous single-crystal semiconductor layer; and g) selectively etching said porous single-crystal semiconductor layer to remove said porous single-crystal semiconductor layer.

2. The process for producing a semiconductor substrate according to claim 1, wherein the etching is carried out in any of an alkali solution, an organic alkali solution and an acid solution containing hydrofluoric acid and nitric acid, kept at 100° C. or below in the step f).

3. The process for producing a semiconductor substrate according to claim 1, wherein grinding said non-porous single-crystal semiconductor region to remove part of said non-porous single-crystal semiconductor region is carried out in the manner that said non-porous single-crystal semiconductor region remains in a thickness of 100 μm or more in the step d).

4. The process for producing a semiconductor substrate according to claim 1, wherein the bonding is carried out by pressing the both substrates in the step c).

5. The process for producing a semiconductor substrate according to claim 1, wherein the selective etching of said porous single-crystal semiconductor layer is carried out in an etching solution including hydrofluoric acid in the step g).

6. The process for producing a semiconductor substrate according to claim 1, wherein the surface of said non-porous single-crystal semiconductor layer is oxidized to form a surface oxide layer and the surface oxide layer is brought into close contact with the insulator substrate in the step c).

7. The process for producing a semiconductor substrate according to claim 1, wherein said insulator substrate is a light-transmitting insulator substrate.

8. The process for producing a semiconductor substrate according to claim 1, wherein said single-crystal semiconductor substrate is mainly composed of silicon.

9. The semiconductor substrate obtained by a process according to any one of claims 1 and 2–8.

* * * * *

UNITED STATES PATENT AND TRADEMARK OFFICE
CERTIFICATE OF CORRECTION

PATENT NO. : 5,695,557

DATED : December 9, 1997

INVENTOR(S) : KENJI YAMAGATA ET AL.

It is certified that error appears in the above-identified patent and that said Letters Patent is hereby corrected as shown below:

<u>COLUMN 1</u>

Line 14, "device" should read --device is formed--.
Line 15, "is formed" should be deleted.
Line 19, "many researches have" should read --much research has--.
Line 20, "made" should read --conducted on SOI,--.
Line 22, "usual" should be deleted.
Line 24, "of devices, this is very well" should read --for devices, it is--.
Line 25, "for" should read --for the--.
Line 26, "aimed" should read --achieved--.
Line 28, "made smaller" should read --reduced--.
Line 29, "tough to radiations" should read -- resistant to radiation--; and "aimed." should read --achieved.--.
Line 30, "notice." should read --attention.--.
Line 52, "providing" should read --providing the--.
Line 54, "SOI" should read --SOI technique--; and
Line 55, "problem. It is a" should read --problem, the--.
Line 58, "little comes into question" should read --comes into question to a small degree--.
Line 61, "greatly different" should read --which greatly differ--.
Line 64, "the" should be deleted.

UNITED STATES PATENT AND TRADEMARK OFFICE
CERTIFICATE OF CORRECTION

PATENT NO. : 5,695,557

DATED : December 9, 1997

INVENTOR(S): KENJI YAMAGATA ET AL.

It is certified that error appears in the above-identified patent and that said Letters Patent is hereby corrected as shown below:

<u>COLUMN 2</u>

Line 1, "support, the substrates may warp in the state of being" should read --support at the step of heating them at about 1,000°C in order to strengthen the bond at their interface,--.
Line 2, "bonded" should be deleted.
Lines 4-5, "substrates, at the step of heating them at about 1,000°C in order to strengthen the bond at their interface." should read --substrates--.
Line 8, "far as" should read --far as is--.
Line 13, "substrates" should read --substrate.--.
Line 20, thereafter" should read --thereafter a--.
Line 22, "by which" should be deleted; and "is" should read --to make it--.
Line 23, "made" should be deleted; and "as" should read --as a--.
Line 24, "bout" should read --about--.
Line 31, "of" should be deleted.
Line 37, "there-" should read --is--.
Line 38, "after" should be deleted; and "out." should read --out thereafter.--.
Line 39, "in that" should read --because--.
Line 43, "of 4 inches" should read --4 inches in--.
Line 44, "of 5 to 6 inches" should read --5 to 6 inches in--.
Line 46, "of 8 inches" should read --8 inches in--; and "thick" should be deleted.
Line 47, "of" should be deleted.
Line 48, "of" should be deleted.

UNITED STATES PATENT AND TRADEMARK OFFICE
CERTIFICATE OF CORRECTION

PATENT NO. : 5,695,557

DATED : December 9, 1997

INVENTOR(S): KENJI YAMAGATA ET AL.

It is certified that error appears in the above-identified patent and that said Letters Patent is hereby corrected as shown below:

COLUMN 2

Line 60, "both" should be deleted.
   Line 65, "may not become poor." should read
     --does not deteriorate.--.
   Line 66, "the" should be deleted.

COLUMN 3

Line 1, "A still" should read --Still--.
   Line 4, "the" should be deleted.
   Line 8, "be well crystallized" should read
     --crystallize well--.
   Line 11, "can achieve no" should read
     --cannot achieve--.
   Line 17, "substrates as previously stated." should
     read --substrates.--.
   Line 26, "substrates" should read --substrates
     which are--.
   Line 29, "no" should read --there are no--.
   Line 30, "substrates" should read --substrates
     which are--.
   Line 32, "devices has been still accomplished." should
     read --devices.--.
   Line 67, "surface, subse-" should read
     --surface. Subse---.

UNITED STATES PATENT AND TRADEMARK OFFICE
CERTIFICATE OF CORRECTION

PATENT NO. : 5,695,557

DATED : December 9, 1997

INVENTOR(S): KENJI YAMAGATA ET AL.

It is certified that error appears in the above-identified patent and that said Letters Patent is hereby corrected as shown below:

<u>COLUMN 4</u>

Line 4, "the" (first occurrence) should be deleted.
Line 5, "stress, the" should read --stress. The--; and "is" should read --is then--.
Line 6, "ethcing" should read --etching--.
Line 16, "having remained" should read --remaining--.
Line 17, "ethcing" should read --etching--.
Line 20, "still" should be deleted.
Line 21, "grinding and then the" should read --grinding. Then--.
Line 24, "having remained" should read --remaining--.
Line 32, "come to" should be deleted.
Line 33, "substrates" should read --substrates, which is--.
Line 37, "thereon" should be deleted.
Line 38, "layer." should read --layer thereon.--.
Line 53, "the" should be deleted.
Line 59, "having remained" should read --remaining--.

<u>COLUMN 5</u>

Line 6, "having remained" should read --remaining--.
Line 15, "the" (first occurrence) should read --a--.
Line 16, "in" should read --at--.
Line 30, "the" should be deleted.
Line 57, "the" should be deleted.
Line 67, "having remained" should read --remaining--.

UNITED STATES PATENT AND TRADEMARK OFFICE
CERTIFICATE OF CORRECTION

PATENT NO. : 5,695,557

DATED : December 9, 1997

INVENTOR(S): KENJI YAMAGATA ET AL.

It is certified that error appears in the above-identified patent and that said Letters Patent is hereby corrected as shown below:

COLUMN 6

Line 9, "in" should read --at--.
    Line 20, "ethcing" should read --etching--.
    Line 43, "remove" should read --removed--.
    Line 45, "a" should be deleted.
    Line 46, "quite" should read --quite a--.
    Line 47, "a thickness" should be deleted.
    Line 48, "made thin" should read --reduced--.
    Line 50, "only" should be deleted.
    Line 54, "a certain" should read --an--.
    Line 58, "So far" should read --As long--; and
        "100µm at least," should read --at least 100µm--.
    Line 61, "come to have" should be deleted.
    Line 62, "for the" should read --to--.
    Line 63, "solution so that the" should read
        --solution, so that--.

COLUMN 7

Line 5, "lessened" should read --reduced--.
    Line 6, "become" should read --are--.
    Line 9, "twice" should read --two--.
    Line 12, "break" should read --breaking--; and
        "a" should read --an--.
    Line 13, "certain" should be deleted.
    Line 22, "usually little" should read --not greatly
        etched when--.
    Line 23, "greatly" should read --greatly etched when--.

UNITED STATES PATENT AND TRADEMARK OFFICE
CERTIFICATE OF CORRECTION

PATENT NO.  : 5,695,557

DATED       : December 9, 1997

INVENTOR(S) : KENJI YAMAGATA ET AL.

It is certified that error appears in the above-identified patent and that said Letters Patent is hereby corrected as shown below:

COLUMN 7

Line 25, "ethcing" should read --etching--.
Line 33, "of" should be deleted; and "ten" should read --tens--.
Line 35, "dred angstroms" should read --dreds of angstroms in--.
Line 48, "fault" should read --faults--.
Line 50, "fault" should read --faults--.

COLUMN 8

Line 7, "1A to 1E" should read --7A to 7E--.
Line 24, "ten" should read --tens of--.
Line 28, "not" should be deleted.
Line 29, "infeasible" should read --feasible--.
Line 31, "are" should read --is--.
Line 47, "flowed" should be deleted.
Line 51, "occasion calls" should read --required--.
Line 61, "completed" should read --been completed--.

COLUMN 9

Line 18, "the" should be deleted; and "break" should read --breaking--.
Line 22, "break" should read --breaking; and "may" should read --may only--.
Line 25, "break" should read --breaking--.

UNITED STATES PATENT AND TRADEMARK OFFICE
CERTIFICATE OF CORRECTION

PATENT NO. : 5,695,557

DATED : December 9, 1997

INVENTOR(S): KENJI YAMAGATA ET AL.

It is certified that error appears in the above-identified patent and that said Letters Patent is hereby corrected as shown below:

COLUMN 9

Line 26, "post-annealing" should read
--post-annealing,--; and "tends" should read --tend--.
Line 31, "deposited to remain as it is" should read
--deposited--.
Line 38, "from" should read --from the--.
Line 46, "water" should be deleted; and "the" should be deleted.
Line 59, "next carried out." should read --carried out next.--; and "this" should read --this step--.
Line 63, "ten" should read --tens of--.

COLUMN 10

Line 5, "have" should read --has--.
Line 12, "little etches" should read --minimally etches the--.
Line 21, "make defectives less" should read --decrease defects--.
Line 22, "occur" should be deleted.
Line 27, "of" should be deleted.
Line 31, "remaining" should be deleted.
Line 34, "break" should read --breaking--.
Line 41, "little" should read --minimally--.
Line 48, "etching," should read --etching, and--.
Line 51, "may react" should read --reacts--.
Line 52, "beforehand deposited" should read --deposited beforehand--.
Line 54, "ethcing" should read --etching--.
Line 55, "made thin" should read --thinned--.

UNITED STATES PATENT AND TRADEMARK OFFICE
CERTIFICATE OF CORRECTION

PATENT NO. : 5,695,557

DATED : December 9, 1997

INVENTOR(S): KENJI YAMAGATA ET AL.

It is certified that error appears in the above-identified patent and that said Letters Patent is hereby corrected as shown below:

COLUMN 11

Line 1, "so much" should be deleted.
Line 6, "fault" should read --faults--.
Line 24, "grinding" should read --grinding,--.
Line 39, "lessened" should read --reduced--.
Line 41, "so many equipments" should read --less equipment--.
Line 42, "not" should read --to--.
Line 57, "break" should read --breaking--.

COLUMN 12

Line 37, "so as" should be deleted; and "to have" should read --had--.
Line 46, "little etched" should read --minimally etched,--.
Line 56, "porous portion of 10μm thick" should read --10μm thick porous portion--.
Line 57, "By the way, during" should read --During--.
Line 59, "remained little" should read --therefore remained barely--.
Line 60, "ethcing" should read --etching--.

UNITED STATES PATENT AND TRADEMARK OFFICE
CERTIFICATE OF CORRECTION

PATENT NO. : 5,695,557

DATED : December 9, 1997

INVENTOR(S): KENJI YAMAGATA ET AL.

It is certified that error appears in the above-identified patent and that said Letters Patent is hereby corrected as shown below:

COLUMN 13

```
Line 5, "none of" should read --no--.
Line 14, "by" should read --with--.
Line 18, "describe" should read --described--.
Line 45, "unetched any longer" should read
    --further unetched--.
Line 50, "an" should read --a--.
```

COLUMN 14

```
Line 8, "describe" should read --described--.
Line 46, "describe" should read --described--.
```

COLUMN 15

```
Line 44, "porous layer of 20µm thick" should read
    --20µm thick porous layer--.
```

COLUMN 16

```
Line 1, "little" should read --barely--.
Line 2, "100 of about 600µm thick" should read
    --100, about 600µm thick,--.
Line 11, "porous portion of 20µm thick" should read
    --20µm thick porous portion--.
Line 12, "By the way, during" should read --During--.
Line 14, "little" should read --barely--.
```

UNITED STATES PATENT AND TRADEMARK OFFICE
CERTIFICATE OF CORRECTION

PATENT NO. : 5,695,557

DATED : December 9, 1997

INVENTOR(S): KENJI YAMAGATA ET AL.

It is certified that error appears in the above-identified patent and that said Letters Patent is hereby corrected as shown below:

COLUMN 16

```
Line 15, "ethcing" should read --etching--.
Line 37, "by" should read --with--.
Line 41, "describe" should read --described--.
Line 52, "selective" should read --selectively--.
Line 62, "unetched any longer." should read
   --substantially unetched.--.
```

COLUMN 17

```
Line 20, "in" should read --to--.
Line 25, "describe" should read --described--.
Line 41, "in" should read --to--.
Line 51, "628" should read --625--.
Line 54, "by" should read --with--.
Line 58, "porous layer of 20µm thick" should read
   --20µm thick porous layer--.
Line 61, "in" should read --to--.
```

COLUMN 18

```
Line 12, "as for" should read --that--; and
   "to have" should read --had--.
Line 25, "µ/min." should read --µm/min.--.
Line 27, "porous portion of 20µm thick" should read
   --20µm thick porous portion--.
Line 28, "By the way, during" should read --During--.
Line 29, "502" should read --702--.
```

UNITED STATES PATENT AND TRADEMARK OFFICE
CERTIFICATE OF CORRECTION

PATENT NO. : 5,695,557

DATED : December 9, 1997

INVENTOR(S): KENJI YAMAGATA ET AL.

It is certified that error appears in the above-identified patent and that said Letters Patent is hereby corrected as shown below:

COLUMN 18

Line 30, "little" should read --barely--.
    Line 31, "510" should read --710--; and
        --ethcing" should read --etching--.
    Line 53, "by" should read --with--.

COLUMN 19

Line 14, "in" should read --to--.
    Line 15, "unetched any longer." should read
      --substantially unetched.--.
    Line 22, "4 x 10 $^{\mu m2}$" should read
      --4 x 10 $\mu m^2$--.
    Line 40, "in" should read --to--.
    Line 45, "describe" should read --described--.
    Line 67, "in" should read --to--.

UNITED STATES PATENT AND TRADEMARK OFFICE
CERTIFICATE OF CORRECTION

PATENT NO. : 5,695,557

DATED : December 9, 1997

INVENTOR(S) : KENJI YAMAGATA ET AL.

It is certified that error appears in the above-identified patent and that said Letters Patent is hereby corrected as shown below:

<u>COLUMN 20</u>

Line 4, "about 0.4" should be deleted.
    Line 5, "$\mu$m thick" should read --a--; and
       "film" should read --film about 0.4 $\mu$m thick--.

Signed and Sealed this

First Day of June, 1999

Attest:

Q. TODD DICKINSON

Attesting Officer      Acting Commissioner of Patents and Trademarks